United States Patent
Nitta et al.

(10) Patent No.: US 10,908,242 B2
(45) Date of Patent: Feb. 2, 2021

(54) MAGNETIC RESONANCE IMAGING APPARATUS AND MULTI-SLICE IMAGING METHOD

(71) Applicant: Canon Medical Systems Corporation, Otawara (JP)

(72) Inventors: Shuhei Nitta, Tokyo (JP); Nobuyasu Ichinose, Otawara (JP); Hiroshi Takai, Nasushiobara (JP); Naho Imamura, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 10 days.

(21) Appl. No.: 16/391,391

(22) Filed: Apr. 23, 2019

(65) Prior Publication Data

US 2019/0346520 A1    Nov. 14, 2019

(30) Foreign Application Priority Data

May 11, 2018  (JP) .................................. 2018-092513

(51) Int. Cl.
*G01R 33/3875*    (2006.01)
*G01R 33/48*    (2006.01)
*G01R 33/565*    (2006.01)
*G01R 33/483*    (2006.01)

(52) U.S. Cl.
CPC ..... *G01R 33/3875* (2013.01); *G01R 33/4826* (2013.01); *G01R 33/4835* (2013.01); *G01R 33/565* (2013.01)

(58) Field of Classification Search
USPC .......................................................... 324/320
See application file for complete search history.

(56) References Cited

U.S. PATENT DOCUMENTS

| | | | |
|---|---|---|---|
| 10,690,742 B2 * | 6/2020 | Nie ...................... | G01R 33/385 |
| 2019/0346519 A1 * | 11/2019 | Nitta .................... | G01R 33/565 |
| 2019/0346521 A1 * | 11/2019 | Nitta .................. | G01R 33/4835 |
| 2020/0041593 A1 * | 2/2020 | Nitta ..................... | G01R 33/543 |
| 2020/0041600 A1 * | 2/2020 | Nitta ..................... | G01R 33/543 |

FOREIGN PATENT DOCUMENTS

| | | |
|---|---|---|
| JP | 7-327960 | 12/1995 |
| JP | 9-182729 | 7/1997 |
| JP | 2010-35991 | 2/2010 |

* cited by examiner

*Primary Examiner* — Rodney E Fuller
(74) *Attorney, Agent, or Firm* — Oblon, McClelland, Maier & Neustadt, L.L.P.

(57) ABSTRACT

A magnetic resonance imaging apparatus includes an interface, processing circuitry, and imaging control circuitry. The interface inputs, to a locator image, a position-indicating region indicating a position in a displayed cross section. The processing circuitry determines a collection direction relating to multi-slice imaging based on a static magnetic field distribution relating to the position-indicating region and the position-indicating region. The imaging control circuitry performs the multi-slice imaging in the collection direction to a plurality of slices in an imaging region which includes at least the position-indicating region.

10 Claims, 8 Drawing Sheets

MAGNETIC RESONANCE IMAGING APPARATUS AND MULTI-SLICE IMAGING METHOD

CROSS-REFERENCE TO RELATED APPLICATIONS

This application is based upon and claims the benefit of priority from the prior Japanese Patent Applications No. 2018-092513, filed May 11, 2018, the entire contents of which are incorporated herein by reference.

FIELD

Embodiments described herein relate generally to a magnetic resonance imaging apparatus and a multi-slice imaging method.

BACKGROUND

A technique relating to a magnetic resonance imaging (MRI) apparatus that performs shimming on a static magnetic field based on a static magnetic field distribution (hereinafter, referred to as "static magnetic field shimming"), is already known. For example, an MRI apparatus optimizes a center frequency of a prepulse, and a center frequency of a radio frequency (RF) pulse for each slice, by performing static magnetic field shimming during multi-slice imaging that involves radiation of prepulses for fat suppression. However, image quality is sometimes not improved depending on inhomogeneity of a static magnetic field in each of the slices in the multi-slice imaging.

DETAILED DESCRIPTION

According to one embodiment, a magnetic resonance imaging apparatus includes an interface, processing circuitry, and imaging control circuitry.

The interface inputs a position-indicating region that indicates a position in a displayed cross section to a locator image.

The processing circuitry determines a collection direction relating to multi-slice imaging based on a static magnetic field distribution relating to the position-indicating region, and said position-indicating region.

The imaging control circuitry performs the multi-slice imaging along the collection direction to a plurality of slices in an imaging region which includes at least the position-indicating region.

An objective is to determine a collection direction in multi-slice imaging so as to improve image quality of a magnetic resonance image.

Hereinafter, embodiments of the magnetic resonance imaging (MRI) apparatus will be described in detail with reference to the drawings. In the following description, structural elements having substantially the same functions and configurations will be denoted by the same reference symbols, and a repetitive description of such elements will be given only where necessary.

Embodiment

Figure 1:
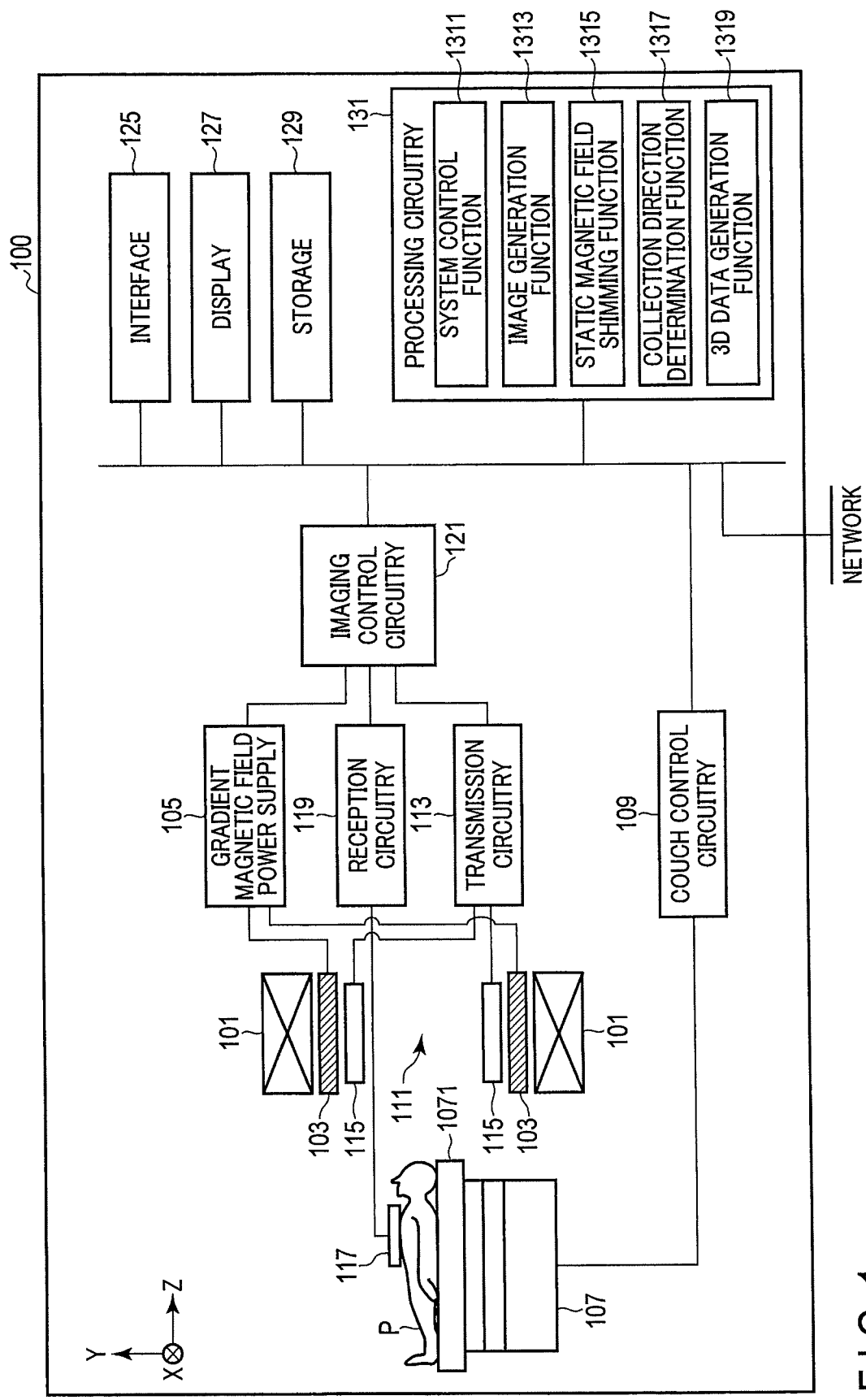
FIG. 1 is a diagram showing a configuration of a magnetic resonance imaging apparatus in an embodiment.

The general configuration of an MRI apparatus 100 in the present embodiment will be described with reference to FIG. 1. FIG. 1 is a diagram showing a configuration of the MRI apparatus 100 in the present embodiment. As shown in FIG. 1, the MRI apparatus 100 includes a static magnetic field magnet 101, a gradient coil 103, a gradient magnetic field power supply 105, a couch 107, couch control circuitry 109, transmission circuitry 113, a transmitter coil 115, a receiver coil 117, reception circuitry 119, imaging control circuitry 121, an interface 125, a display 127, a storage 129, and processing circuitry 131. The interface 125, the display 127, the storage 129, and the processing circuitry 131 are connected either wirelessly or with wires for data transmission. A subject P is not included in the MRI apparatus 100.

The static magnetic field magnet 101 is a magnet formed in a hollow, approximately cylindrical shape. The static magnetic field magnet 101 generates an approximately uniform static magnetic field in the inner space. For example, a superconducting magnet or the like is used as the static magnetic field magnet 101.

The gradient coil 103 is a coil formed in a hollow, approximately cylindrical shape. The gradient coil 103 is arranged inside the static magnetic field magnet 101. The gradient coil 103 is formed by combining three coils respectively corresponding to the X-, Y-, and Z-axes which are orthogonal to each other. The Z-axis direction is defined as the same as the orientation of the static magnetic field. In addition, the Y-axis direction is a vertical direction, and the X-axis direction is a direction perpendicular to each of the Z-axis and the Y-axis. The three coils of the gradient coil 103 individually receive an electric current from the gradient magnetic field power supply 105 and respectively generate gradient magnetic fields in which magnetic field intensity changes along each of the X-, Y-, and Z-axes.

The gradient magnetic fields of the X, Y, and Z-axes generated by the gradient coil 103 form, for example, a gradient magnetic field for slice selection, a gradient magnetic field for phase encoding, and a gradient magnetic field for frequency encoding (also referred to as a readout gradient magnetic field). The gradient magnetic field for slice selection is used to determine an imaging slice at will. The gradient magnetic field for phase encoding is used to change the phase of an MR signal in accordance with the spatial position. The gradient magnetic field for frequency encoding is used to change the frequency of an MR signal in accordance with the spatial position. The gradient magnetic fields of the X, Y, and Z-axes generated by the gradient coil 103 are used as a re-convergence pulse in which the direction of the gradient magnetic field is twice reversed in order to re-converge the phase of spins on the X-Y plane in a gradient echo method. In addition, the gradient magnetic fields of the X-, Y-, and Z-axes generated by the gradient coil 103 are used as offset of first-order shimming of a static magnetic field, which will be described later.

The gradient magnetic field power supply 105 is a power supply device that supplies an electric current to the gradient coil 103 under the control of the imaging control circuitry 121.

The couch 107 is an apparatus including a couch top 1071 on which a subject P is placed. The couch 107 inserts the couch top 1071 on which the subject P is placed into the bore 111 under the control of the couch control circuitry 109. The couch 107 is installed in, for example, an examination room in such a manner that the longitudinal axis of the couch 107 is parallel to the central axis of the static magnetic field magnet 101.

The couch control circuitry 109 is circuitry that controls the couch 107. The couch control circuitry 109 drives the couch 107 in accordance with an operator's instruction via the interface 125 to move the couch top 1071 in a longitudinal direction and a vertical direction. The couch control circuitry 109 is an example of a means that realizes a couch controller.

The transmitter 113 supplies a high-frequency pulse modulated by a Larmor frequency to the transmitter coil 115 by the control of the imaging control circuitry 121. The transmission circuitry 113 is an example of a means that realizes a couch controller.

The transmitter coil 115 is an RF coil provided inside the gradient coil 103. The transmitter coil 115 generates an RF pulse corresponding to a radio frequency magnetic field in accordance with an output from the transmission circuitry 113. The transmitter coil 115 is, for example, a whole-body coil (WB coil) including a plurality of coil elements. The WB coil may be used as a transmitter/receiver coil. The transmitter coil 115 may also be a WB coil made of a single coil.

The receiver coil 117 is an RF coil provided inside the gradient coil 103. The receiver coil 117 receives MR signals that are emitted from the subject P, caused by a radio frequency magnetic field. The receiver coil 117 outputs the received MR signals to the reception circuitry 119. The receiver coil 117 is a coil array including, for example, one or more, typically, a plurality of coil elements. In FIG. 1, the transmitter coil 115 and the receiver coil 117 are illustrated as separate RF coils; however, the transmitter coil 115 and the receiver coil 117 may be realized by an integrated transmitter/receiver coil. The transmitter/receiver coil is, for example, a local transmitter/receiver RF coil, such as a head coil, to serve a body part targeted for imaging in the subject P.

The reception circuitry 119 generates a digital MR signal (hereinafter referred to as "MR data") based on the MR signal output from the receiver coil 117 under the control of the imaging control circuitry 121. Specifically, the reception circuitry 119 performs various types of signal processing on the MR signal output from the receiver coil 117, and then performs analog-to-digital (A/D) conversion on the data subjected to the various types of signal processing. The reception circuitry 119 samples the A/D-converted data. The reception circuitry 119 thereby generates MR data. The reception circuitry 119 outputs the generated MR data to the imaging control circuitry 121. The reception circuitry 119 is an example of a means that realizes a receiver.

The imaging control circuitry 121 controls, for example, the gradient magnetic field power supply 105, the transmission circuitry 113, and the reception circuitry 119 in accordance with an imaging protocol output from the processing circuitry 131 to perform imaging on the subject P. The imaging protocol includes various pulse sequences corresponding to the examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and time width of the high frequency pulse supplied from the transmission circuitry 113 to the transmitter coil 115, timing of the supply of the high frequency pulse from the transmission circuitry 113 to the transmitter coil 115, and timing of reception of the MR signal at the receiver coil 117, etc. The imaging control circuitry 121 is an example of a means that realizes an imaging controller.

The interface 125 is realized by, in order to receive various instructions and information inputs from an operator, a switch button, a mouse, a keyboard, a touch pad with which an input operation can be performed by touching its operation screen, a touch screen in which a display screen and a touch pad are integrated, and non-contact input circuitry using an optical sensor, or sound input circuitry, etc. The interface 125, which is connected to the processing circuitry 131, etc., converts outputs an input operation received from the operator into an electric signal, and outputs the signal to the processing circuitry 131. In the present specification, the interface is not limited to physical operation components such as a mouse and a keyboard. For example, the interface 125 also includes electrical signal processing circuitry that receives an electrical signal corresponding to an input operation through an external input device provided independently from the apparatus, and outputs the electrical signal to the system control circuitry. The interface 125 is an example of a means that realizes an input unit.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field. The display 127 is an example of a means that realizes a display.

The storage 129 stores, for example, MR data filled in the k-space with the use of the image generation function 1313, image data generated by the image generation function 1313, imaging protocols, imaging conditions including the imaging parameters defining the imaging protocols, and the like. The storage 129 stores programs corresponding to various functions executed by the processing circuitry 131. The storage 129 stores a program for calculating a 0-order shimming value and first-order shimming values by static magnetic field shimming in each slice (hereinafter, a calculation program). The 0-order shimming value corresponds to a resonance frequency of water in each of the slices in multi-slice imaging. The first-order shimming values are correction values for the first components of inhomogeneity of the static magnetic field. Specifically, the first-order shimming values correspond to values of currents respectively supplied to the three gradient coils from the gradient magnetic power supply 105 so as to correct the X, Y, and Z components of inhomogeneity of the static magnetic field in each of the slices.

The storage 129 is, for example, a semiconductor memory element, such as a RAM (Random Access Memory) and a flash memory, a hard disk drive, a solid state drive, or an optical disk, etc. The storage device 129 may also be, for example, a drive that performs reading and writing various kinds of information on a portable storage medium such as a CD-ROM drive, a DVD drive, or a flash memory. The storage 129 is an example of a means that realizes a storage unit.

The processing circuitry 131 includes, as hardware resources, a processor and a memory such as a ROM and a RAM, which are not shown, and controls the present MRI apparatus 100. The processing circuitry 131 includes a system control function 1311, an image generation function 1313, a static magnetic field shimming function 1315, a collection direction determination function 1317, and a three-dimensional data generation function 1319. The various types of functions executed by the system control function 1311, the image generation function 1313, the static magnetic field shimming function 1315, the collection direction determination function 1317, and the three-dimensional data generation function 1319 are stored in the storage 129 in a form of a computer-executable program. The processing circuitry 131 is a processor which reads a program corresponding to each of those functions from the storage 129 and executes the program to realize the function corresponding to the program. In other words, the processing circuitry 131, in a state where each of the programs is read, has a plurality of the functions etc. shown in the processing circuitry 131 of FIG. 1.

FIG. 1 illustrates the case where the various functions are realized in a single processor; however, the processing circuitry 131 may be constituted by a combination of a plurality of independent processors, and the functions may be realized by the processors executing the programs. In other words, each of the above-mentioned functions may be configured as a program, and executed by a single processing circuit; alternatively, a specific function may be implemented in a dedicated independent program-execution circuit. Although FIG. 1 illustrates the single storage 129 storing a program corresponding to each processing function, a plurality of storage apparatuses may be provided and the processing circuitry 131 may be configured to read a corresponding program from each storage apparatus.

The term "processor" used in the above description means, for example, a CPU (Central Processing Unit), a GPU (graphics processing unit), or circuitry such as an ASIC (application specific integrated circuit), or a programmable logic device (e.g., an SPLD (simple programmable logic device), a CPLD (complex programmable logic device), or a FPGA (field programmable gate array)).

The processor realizes various functions by reading and executing programs stored in the storage 129. A program may be directly integrated into the circuitry of the processor, instead of storing the program on the storage 129. In this case, the function is realized by reading and executing the program integrated into the circuitry. Similarly, each of the couch control circuitry 109, the transmission circuitry 113, the reception circuitry 119, and the imaging control circuitry 121, etc. are also configured as an electronic circuit, such as the above processor.

The processing circuitry 131 controls the MRI apparatus 100 by the system control function 1311. Specifically, the processing circuitry 131 reads the system control program stored in the storage 129, loads it in the memory, and controls each circuitry of the present MRI apparatus 100 in accordance with the loaded system control program. For example, the processing circuitry 131 reads an imaging protocol from the storage 129 based on imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P. The processing circuitry 131 that executes the system control function 1311 is an example of a means that realizes a system controller.

The processing circuitry 131 fills MR data along a readout direction of k-space in accordance with an intensity of the readout gradient field by the image generation function 1313. The processing circuitry 131 generates an MR image by executing a Fourier transform to the MR data filled in k-space. The processing circuitry 131 outputs the generated MR image to the display 127 and the storage 129. The processing circuitry 131 that performs the image generation function 1313 is an example of a means that realizes an image generation unit.

Figure 2:
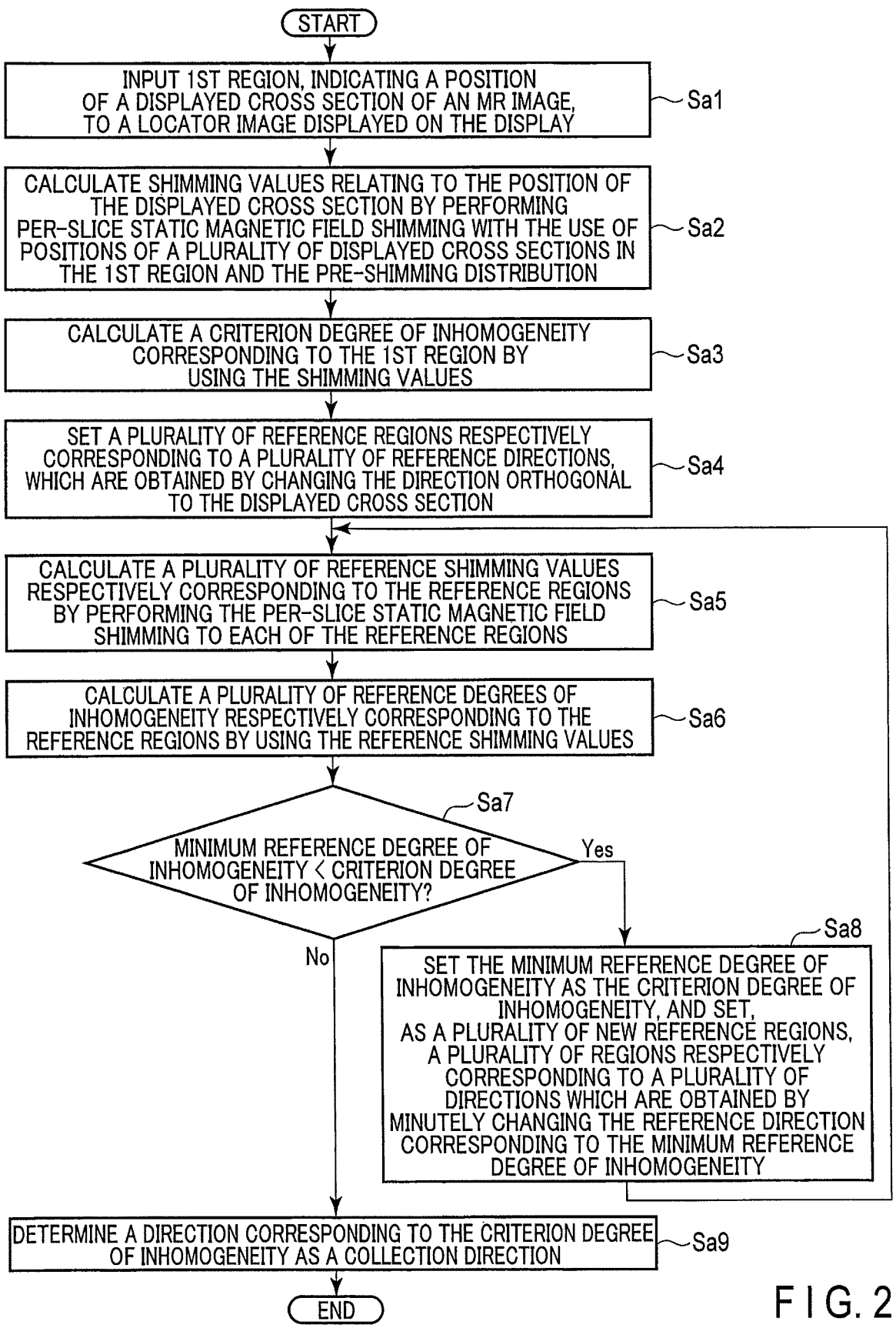
FIG. 2 is a diagram showing an example of the steps of a collection direction determination process in the embodiment.

The above is the general description of the overall configuration of the MRI apparatus 100 according to the present embodiment. Hereinafter, the operations relating to the static field distribution shimming function 1315 and the collection direction determination function 1317 in the present embodiment will be described with reference to FIG. 2. FIG. 2 is a diagram showing an example of the steps of a process relating to determination of a collection direction (hereinafter, "collection direction determination process"). A collection direction is a direction orthogonal to a series of slices relating to the multi-slice imaging.

The imaging control circuitry 121 performs shimming imaging to the subject P in advance of the performance of the collection direction determination process. The imaging control circuitry 121 performs shimming imaging by, for example, multi-slice imaging adopting a double-echo method in which two different echo time intervals are used. The shimming imaging may be performed by other imaging methods, such as a multi-slice imaging method adopting a triple-echo method in which three different echo time intervals are used. The shimming imaging is performed to a second region that overlaps at least a part of a first region indicating a position in a displayed cross section (the position-indicating region), which will be later described. Specifically, the imaging control circuitry 121 controls the gradient magnetic power supply 105, the transmission circuitry 113, and the reception circuitry 119, in accordance with the double-echo method. The imaging control circuitry 121 collects MR signals corresponding to two echo time intervals via the receiver coil 117 and the reception circuitry 119 by shimming imaging.

The processing circuitry 131 generates, by the static magnetic field shimming function 1315, a plurality of static magnetic field distributions respectively corresponding to a plurality of slices in the second region, based on the MR signals collected by the shimming imaging. Each generated static magnetic field distribution corresponds to a static magnetic field distribution relating to the position-indicating region. Specifically, the processing circuitry 131 generates two complex images respectively corresponding to the two echo time intervals, based on the MR signals of the slices in the second region. The processing circuitry 131 performs complex conjugate calculation to one of the two complex images, and calculates a product of the complex image to which complex conjugate calculation has been performed and the other complex image to which complex conjugate calculation has not been performed. The processing circuitry 131 generates a phase difference image by using a phase of the calculated product.

The processing circuitry 131 generates, by the static magnetic field shimming function 1315, an intensity image by using at least one of the two complex images. The processing circuitry 131 extracts a background region in the phase difference image based on the intensity image. The processing circuitry 131 removes the background from the phase difference image by using the extracted background region. The processing circuitry 131 performs a phase unwrap process to the phase difference image, from which the background has been removed, in consideration of continuity of phase. The processing circuitry 131 performs linear conversion to a value of the phase difference in each pixel in the phase difference image to which the phase unwrap process has been performed, by using an echo interval corresponding to a difference of the two echo time intervals and a gyromagnetic ratio, thereby generating a two-dimensional static magnetic field distribution as frequency information. The processing circuitry 131 generates a three-dimensional static field distribution (hereinafter, "pre-shimming distribution") by coupling multiple two-dimensional static field distributions. The processing circuitry 131 that performs the static magnetic field shimming function 1315 is an example of a means that realizes a static magnetic field shimming unit. The pre-shimming distribution may be stored in the storage 129 as default setting, in accordance with a body part targeted for imaging, sex, age, and so on. In this case, the shimming imaging is unnecessary.

The imaging control circuitry 121 performs locator imaging in advance of the performance of the collection direction determination process. Through the image generation function 1313, the processing circuitry 131 generates a locator image by using an MR signal collected by the locator imaging. The processing circuitry 131 outputs the generated locator image to the display 127.

(Collection Direction Determination Process)

(Step Sa1)

The display 127 displays a locator image. The interface 125 inputs, to the locator image, a first region that indicates a position of the displayed cross section relating to an MR image, which will be described later, generated by the image generation function 1313. The interface 125 may input positions of a plurality of slices corresponding to a plurality of displayed cross sections. In this case, the processing circuitry 131 generates a first region by integrating the plurality of displayed cross sections. The image used for the purpose of inputting a first region is not limited to a locator image. In the description hereinafter, an image used for the purpose of inputting a first region or a position of a displayed cross section will be referred to as "locator image" for the sake of explanation.

(Step Sa2)

The processing circuitry 131 performs, through the static magnetic field shimming function 1315, per-slice static magnetic field shimming to the slices respectively corresponding to the positions of the displayed cross sections in the first region, by using the positions of the displayed cross sections in the first region and the pre-shimming distribution. Specifically, the processing circuitry 131 reads, by the static magnetic field shimming function 1315, a calculation program from the storage 129, and develops it in its own memory. The processing circuitry 131 calculates 0-order and first-order shimming values for each of the slices in the first region with the use of the calculation program. The processing circuitry 131 associates the calculated 0-order and first-order shimming values with a slice corresponding to the position of the displayed cross section. A basic expression of the static magnetic field shimming will be described below, and the per-slice static magnetic field shimming will be then be described.

An example of the basic expression relating to the static magnetic field shimming is shown in the expression (1) below.

$$b_0'(k)(x,y,z) = a_0 + a_1 x + a_2 y + a_3 z + b_0(x,y,z) \qquad (1)$$

Herein, (x,y,z) in the expression (1) represents a three-dimensional position in a space. Specifically, the variable x represents a position with respect to a center of the static magnetic field in the horizontal direction (X-axis) (hereinafter "magnetic field center"), which is defined as an origin. The variable y represents a position with respect to the magnetic field center in the vertical direction (Y-axis) as an origin. The variable z represents a position with respect to the magnetic field center in the axial direction (Z-axis) as an origin. Herein, a unit of each of x, y, z is [m]. $a_0$ in the expression (1) is degree-0 shimming value. $a_0$ represents a value to which a minus sign is put to a center frequency of an RF pulse. A unit of $a_0$ is [ppm]. $a_1$, $a_2$, and $a_3$ in the expression (1) are first-order shimming values. Specifically, $a_1$, $a_2$, and $a_3$ represent an amount of change in a resonance frequency per unit length for each of the X-, Y-, and Z-axes, respectively. An amount of change in a resonance frequency per unit length corresponds to a gradient of the gradient magnetic field, in other words, a value of current applied to the gradient coil 103. A unit of $a_1$, $a_2$, $a_3$ is [ppm/m]. $b_0(x,y,z)$ in the expression (1) is a resonance frequency in the position (x,y,z) before the static magnetic field shimming is performed. In other words, $b_0(x,y,z)$ is a result of converting a three-dimensional static magnetic field distribution corresponding to the aforementioned pre-shimming distribution into a resonance frequency, that is a distribution of resonance frequency representing inhomogeneity of a static magnetic field. A unit of $b_0(x,y,z)$ is [ppm]. $b_0'(x,y,z)$ is a difference value representing a difference between a resonance frequency in the position (x,y,z) after shimming and a center frequency of an RF pulse. A unit of $b_0'(x,y,z)$ is [ppm].

The left side of the expression (1), namely the difference value regarding the resonance frequency after shimming and the center frequency of the RF pulse becomes a desirable condition for static magnetic field shimming, if the value is smaller. If a set of all positions of a plurality of pixels in a foreground region (hereinafter, foreground pixels) corresponding to a non-foreground region (hereinafter, a position set S) is considered for an image representing the pre-shimming distribution, the position set S can expressed by the expression (2) below:

$$S \in \{(x_i, y_i, z_i)^T\}, i=1,2,\ldots,N \qquad (2)$$

In the expression (2), i represents a serial number of a foreground pixel. N represents a total number of the foreground pixels.

At this time, N expressions (1) can be held for all the foreground pixels in the image of the pre-shimming distribution. If the N expressions (1) for all the foreground pixels are combined, the expression (3) below can be obtained:

$$\begin{pmatrix} b'_0(x_1, y_1, z_1) \\ \vdots \\ b'_0(x_N, y_N, z_N) \end{pmatrix} = \begin{pmatrix} 1 & x_1 & y_1 & z_1 \\ \vdots & \vdots & \vdots & \vdots \\ 1 & x_N & y_N & z_N \end{pmatrix} \begin{pmatrix} a_0 \\ a_1 \\ a_2 \\ a_3 \end{pmatrix} + \begin{pmatrix} b_0(x_1, y_1, z_1) \\ \vdots \\ b_0(x_N, y_N, z_N) \end{pmatrix} \quad (3)$$

In the expression (3), if a vector b', a matrix X, a vector a, and a vector b are defined as follows:

$$b' = \begin{pmatrix} b'_0(x_1, y_1, z_1) \\ \vdots \\ b'_0(x_N, y_N, z_N) \end{pmatrix}, X = \begin{pmatrix} 1 & x_1 & y_1 & z_1 \\ \vdots & \vdots & \vdots & \vdots \\ 1 & x_N & y_N & z_N \end{pmatrix},$$

$$a = \begin{pmatrix} a_0 \\ a_1 \\ a_2 \\ a_3 \end{pmatrix}, b = \begin{pmatrix} b_0(x_1, y_1, z_1) \\ \vdots \\ b_0(x_N, y_N, z_N) \end{pmatrix}$$

The expression (3) can then be expressed as shown in the expression (4) below:

$$b' = Xa + b \quad (4)$$

As aforementioned, the smaller each element of the vectors in the left side of the expression (1), namely, the left side of the expression (3) or (4), is, the more ideal it becomes for the static magnetic field shimming. Accordingly, uniformity of the static magnetic field is defined as an amplitude of the vector b', and the cost function E regarding the vector a, which is obtained by combining a 0-order shimming value and first-order shimming values, is defined as the expression (5).

$$E(a) = (Xa + b)^T \Omega^{-1} (Xa + b) \quad (5)$$

The matrix $\Omega$ in the expression (5) is a matrix for normalization in accordance with the importance of each element in the vector b' and correlation between the elements. For example, if the matrix $\Omega$ is a unitary matrix, the cost function is simply a sum of squares of a vector element. If the matrix $\Omega$ is a covariance matrix relating to the vector b', the cost function is a square of Mahalanobis' distance. The vector a, which is a combination of the 0-order shimming value and first-order shimming values, that minimizes the cost function (5) can be determined by the expression (6) shown below with the use of a least-squares method.

$$\hat{a} = \operatorname{argmin}_a E(a) \quad (6)$$

The per-slice static magnetic field shimming will be described below. Let us suppose a set of positions, $S_j$, of a plurality of foreground pixels per slice in the first region (in which per-slice static magnetic field shimming is performed), the position set $S_1$ can be expressed by the expression (7) below, for example:

$$S_j \in \{(x_i, y_i, z_i)T\} j=1,2,\ldots,M, i=1,2,\ldots,N_j \quad (7)$$

In the expression (7), j represents a serial number of the slices of the first region. M in the expression (7) represents the number of slices in the first region. In the expression (7) represents a serial number of a foreground pixel. $N_j$ represents the total number of the foreground pixels in a slice j.

In the per-slice static magnetic field shimming, $N_1$ expressions (1) can be established for all the foreground pixels $N_j$ for each slice j in the first region. In the slice j, the vector $b_j'$, the matrix $X_j$, the vector $a_j$, and the vector $b_j$ are defined as follows:

$$b_j' = \begin{pmatrix} b'_0(x_1, y_1, z_1) \\ \vdots \\ b'_0(x_{N_j}, y_{N_j}, z_{N_j}) \end{pmatrix}, X_j = \begin{pmatrix} 1 & x_1 & y_1 & z_1 \\ \vdots & \vdots & \vdots & \vdots \\ 1 & x_{N_j} & y_{N_j} & z_{N_j} \end{pmatrix}$$

$$a_j = \begin{pmatrix} a_0(j) \\ a_1(j) \\ a_2(j) \\ a_3(j) \end{pmatrix}, b_j = \begin{pmatrix} b_0(x_1, y_1, z_1) \\ \vdots \\ b_0(x_{N_j}, y_{N_j}, z_{N_j}) \end{pmatrix}$$

The vector $b_j$ corresponds to the entire foreground pixels in the static magnetic field distribution corresponding to the slice j, among the plurality of static magnetic field distributions related to the aforementioned pre-shimming distribution. In the slice j, if the $N_j$ expressions (1) for all the foreground pixels are combined, the expression (8) below can be obtained:

$$b_j' = X_j a_j + b_j \quad (8)$$

For the expression (8), the processing circuitry 131 defines a cost function similarly to the expression (5) by the static magnetic field shimming function 1315. The processing circuitry 131 calculates the vector $a_j$, which is a combination of the 0-order and first-order shimming values, for each slice in the first region by the least-squares method, with which the cost function relating to the expression (8) is minimized. In other words, the processing circuitry 131 calculates M patterns of vector $a_j$ for each slice in the first region, as shimming values.

(Step Sa3)

The processing circuitry 131 calculates, by the static magnetic field shimming function 1315 and the collection direction determination function 1317, a criterion degree of inhomogeneity indicating inhomogeneity of a static magnetic field in the first region by using the shimming values. Specifically, the processing circuitry 131 generates, by the static magnetic field shimming function 1315, a three-dimensional static magnetic field distribution after being subjected to the per-slice static magnetic field shimming in the first region (hereinafter, "criterion post-shimming distribution"), by using the calculated shimming values. In more details, the processing circuitry 131 calculates the static magnetic field distribution after being subjected to the per-slice static magnetic field shimming by substituting the shimming values and the pre-shimming distribution into the expression (8). The processing circuitry 131 generates the criterion post-shimming distribution by coupling the static magnetic field distributions of the slices in the first region, which are calculated by the expression (8). The processing circuitry 131 causes the storage 129 to store the criterion post-shimming distribution in association with the first region.

The processing circuitry 131 calculates, by the collection direction determination function 1317, the criterion degree of inhomogeneity by using the criterion post-shimming distribution. Specifically, the processing circuitry 131 calculates the criterion degree of inhomogeneity from the inhomogeneity of the static magnetic field in the first region by using a plurality of voxel values in the criterion post-shimming distribution. The criterion degree of inhomogeneity is, for example, a standard deviation of the plurality of voxel values in the criterion post-shimming distribution corresponding to the first region. The inhomogeneity of the static magnetic field is not limited to a standard deviation, and may be a statistical value, such as dispersion, for example. The processing circuitry 131 causes the storage 129 to store the calculated criterion degree of inhomogeneity in association with the first region.

The criterion degree of inhomogeneity may be calculated for a region that is other than the first region and that is included in the second region. For example, if such "other region" is defined by a series of slices (hereinafter, "other group of slices") orthogonal to a direction different from a direction orthogonal to the displayed cross section, the processing circuitry 131 performs the per-slice static magnetic field shimming to the other region by the static magnetic field shimming function 1315. In this case, the processing circuitry 131 calculates a criterion degree of inhomogeneity corresponding to the other region by performing the process in step Sa2 and step Sa3 through the static magnetic field shimming function 1315. The other region is a region which overlaps at least a part of the first region, and in which the other group of slices is defined by the axial direction.

(Step Sa4)

The processing circuitry 131 sets, by the collection direction determination function 1317, a plurality of reference directions, which are obtained as a result of minute changes of the direction orthogonal to the displayed cross section, and sets a plurality of reference regions respectively corresponding to the reference directions. Specifically, the processing circuitry 131 reads angles corresponding to the minute changes stored in the storage 129 in advance (hereinafter, "minute angles") from the storage 129. A minute angle corresponds to, for example, a minimum angle with which a collection direction is distinguishable with respect to an imaging condition pertaining to the multi-slice imaging. The processing circuitry 131 sets a plurality of orientations with reference to a direction orthogonal to the displayed cross section as a plurality of reference directions, in a solid angle using a minute angle as a half-vertical angle with respect to the direction orthogonal to the displayed cross section. The plurality of orientations are, for example, 4, 8, or 16, and are stored in the storage 129 in advance, in association with the aforementioned minimum angle.

The processing circuitry 131 sets, by the collection direction determination function 1317, a plurality of reference regions respectively corresponding to the plurality of reference directions, based on the cross sections respectively orthogonal to the reference directions (hereinafter, "reference cross sections"), and the first region. Specifically, the processing circuitry 131 sets the reference regions in each of the reference directions, in such a manner that the region formed by the reference cross sections includes the first region. The processing circuitry 131 causes the storage 129 to store the reference directions and the reference regions in association with each other.

(Step Sa5)

The processing circuitry 131 performs the per-slice static magnetic field shimming to each of the reference regions by the static magnetic field shimming function 1315. The processing circuitry 131 calculates a plurality of shimming values (hereinafter, "reference shimming values") respectively corresponding to the reference regions through the performance of the per-slice static magnetic field shimming. Specifically, the processing circuitry 131 generates static magnetic field distributions in the slices orthogonal to the reference directions (hereinafter, "reference pre-shimming static magnetic field distributions") by performing a multi-planar reconstruction (hereinafter, "MPR") process to the pre-shimming distributions with the use of the reference directions. The processing circuitry 131 performs the per-slice static magnetic field shimming by using the positions of the slices in the reference regions and the reference pre-shimming static magnetic field distributions, and calculates a plurality of reference shimming values. When calculating the plurality of reference shimming values respectively corresponding to the reference regions, the position set $S_j$ in the expression (7) is set per slice in each of the reference regions. In addition, j in the expression (7) is a serial number of a slice in each of the reference regions. M in the expression (7) represents the number of slices in each of the reference regions. Since the procedure of calculating the reference shimming values by the per-slice static magnetic field shimming is similar to step Sat, descriptions thereof are omitted. The processing circuitry 131 causes the storage 129 to store the calculated reference shimming values in association with the reference regions which have been used for the per-slice static magnetic field shimming.

(Step Sa6)

The processing circuitry 131 calculates, by the static magnetic field shimming function 1315 and the collection direction determination function 1317, a plurality of reference degrees of inhomogeneity respectively corresponding to the reference regions for each reference region, by using the reference shimming values. Specifically, the processing circuitry 131 generates, by the static magnetic field shimming function 1315, a three-dimensional static magnetic field distribution after being subjected to the static magnetic field shimming in the reference region, by using the reference shimming values. In more details, the processing circuitry 131 calculates the static magnetic field distribution after being subjected to the per-slice static magnetic field shimming for each slice of the reference region, by substituting the reference shimming values and the reference pre-shimming distribution into the expression (8). The processing circuitry 131 generates a reference post-shimming distribution by coupling the static magnetic field distributions of the slices in the reference region, which are calculated by the expression (8). The processing circuitry 131 causes the storage 129 to store the reference post-shimming distribution in association with the reference region used when the reference post-shimming distribution is generated.

The processing circuitry 131 calculates, by the collection direction determination function 1317, reference degree of inhomogeneity for each reference direction associated with each reference region, by using the reference post-shimming distribution. Specifically, the processing circuitry 131 calculates a reference degree of inhomogeneity from the inhomogeneity of the static magnetic field in the reference region by using a plurality of voxel values in the reference post-shimming distribution. The reference degree of inhomogeneity is a standard deviation calculated based on the voxel values in the reference region, for example. The processing circuitry 131 causes the storage 129 to store the plurality of reference degrees of inhomogeneity calculated for each reference region, in association with the pertaining reference region.

(Step Sa7)

The processing circuitry 131 compares a minimum reference degree of inhomogeneity among the reference degrees of inhomogeneity, with the criterion degree of inhomogeneity by the collection direction determination function 1317. If the minimum reference degree of inhomogeneity is smaller than the criterion degree of inhomogeneity (Yes in step Sa7), the process in step Sa8 is performed. If the minimum reference degree of inhomogeneity is equal to or larger than the criterion degree of inhomogeneity (No in step Sa7), the process in step Sa9 is performed.

(Step Sa8)

The processing circuitry 131 sets the minimum reference degree of inhomogeneity as a new criterion degree of inhomogeneity by the collection direction determination function 1317. The processing circuitry 131 sets a plurality of regions respectively corresponding to a plurality of directions obtained as a result of minute changes of the reference direction corresponding to the minimum reference degree of inhomogeneity, as a plurality of new reference regions. Since the setting of the new reference regions is approximately the same as the process in step Sa4, descriptions thereof are omitted. After this step, the process in steps Sa5 to Sa1 is repeated.

(Step Sa9)

The processing circuitry 131 determines, by the collection direction determination function 1317, the direction corresponding to the criterion degree of inhomogeneity as a collection direction. The processing circuitry 131 determines the region pertaining to the criterion degree of inhomogeneity as a collection range in multi-slice imaging (hereinafter, "third region"). A collection range in the multi-slice imaging may be called an imaging region. The third region is a region that includes at least the first region. The processing circuitry 131 causes the storage 129 to store the shimming value relating to the criterion degree of inhomogeneity along with the determined collection direction and the third region. The procedure of the process in step Sa1 through Sa8 corresponds to a method of steepest descent. This is adopted for the purpose of determining a collection direction through a comparison of a reference degree of inhomogeneity, calculated by consecutively changing the reference direction with a criterion degree of inhomogeneity, with the use of a direction orthogonal to the displayed cross section, pre-shimming distributions, and the first region as initial conditions. In other words, the collection direction determined by the collection direction determination function 1317 is a direction closest to the direction orthogonal to the displayed cross section, with respect to the third region in which the inhomogeneity of the static magnetic field in the first region is reduced. The processing circuitry 131, that performs the collection direction determination function 1317, is an example of a means that realizes a collection direction determination unit.

The procedure of determining a collection direction is not limited to the foregoing description of step Sa2 through step Sag. For example, the processing circuitry 131 may determine a collection direction by a simulation program implemented as the collection direction determination function 1317. For example, this simulation program calculates reference degrees of inhomogeneity for all the reference directions relating to the second region, and determines a direction corresponding to a minimum degree of inhomogeneity among the calculated reference degrees of inhomogeneity as a collection direction.

The processing circuitry 131 may generate, by the collection direction determination function 1317, a differential image through differentiation of the reference post-shimming distribution, and may determine a collection region by performing an optimization process in which a sum of pixel values in the generated differential image (hereinafter, "differential sum") serves as an evaluation function. To determine a collection direction, this optimization process is performed so that the evaluation function is repeatedly calculated in such a manner that the change of the differential sum with respect to the change of the reference direction is reduced and the differential sum becomes a local minimum, while the reference directions in the second region are changed. In the calculation of the reference degrees of inhomogeneity, the processing circuitry 131 may calculate a degree of inhomogeneity corresponding to a reference direction by performing a weight summation, etc. for each of the slices orthogonal to the reference direction. The weight for each slice is set as appropriate in accordance with an operator's instruction input through the interface 125, a body part targeted for imaging, and an object of imaging, etc., and the weight is stored in the storage 129.

Figure 3:
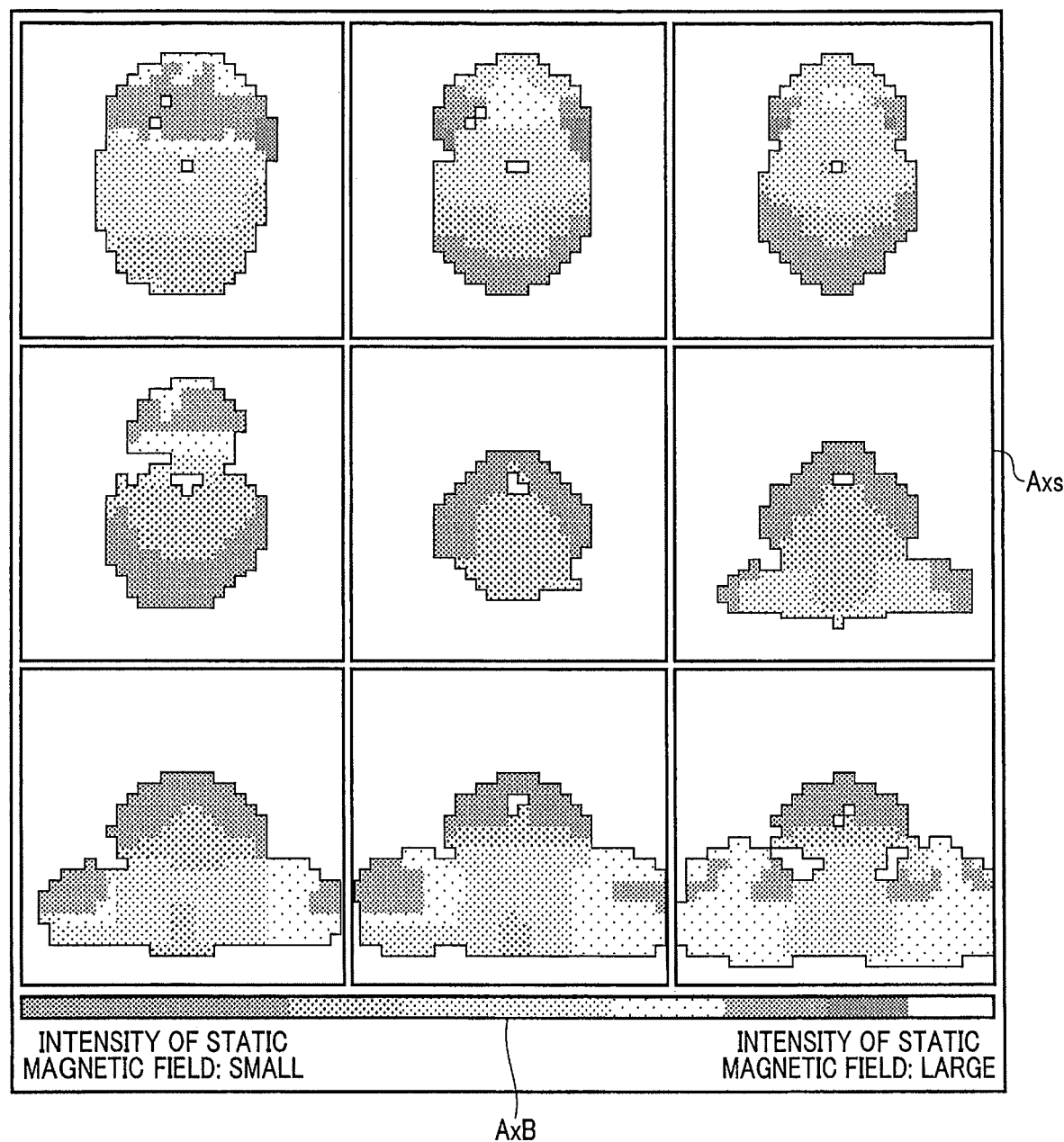
FIG. 3 is a diagram showing an example of a plurality of static magnetic field distributions corresponding to multiple slices in an axial plane before static magnetic field shimming is performed in the embodiment.
Figure 4:
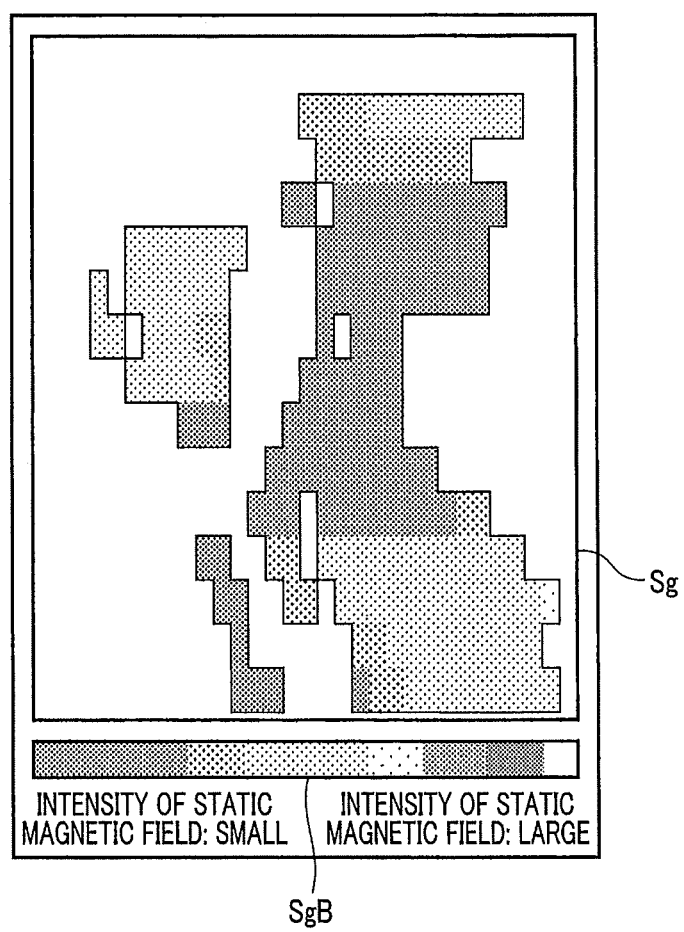
FIG. 4 is a diagram showing an example of a static magnetic field distribution corresponding to a sagittal plane obtained before static magnetic field shimming is performed in the embodiment.

The processing circuitry 131 may determine, by the collection direction determination function 1317, a direction in which inhomogeneity of a static magnetic field after being subjected to the per-slice static magnetic field shimming is at its minimum, among the axial direction, the coronal direction, and the sagittal direction. FIG. 3 is a diagram showing an example of a plurality of static magnetic field distributions Axs before being subjected to static magnetic field shimming to multiple slices in an axial plane. FIG. 4 is a diagram showing an example of a static magnetic field distribution Sg in a sagittal plane obtained before static magnetic field shimming is performed. The hatching in FIGS. 3 and 4 shows an intensity of the static magnetic field, as shown by the bar AxB in the legend of FIG. 3 and by the bar SgB in the legend of FIG. 4. As shown in FIGS. 3 and 4, the static magnetic field distribution of the axial plane, Axs, is approximately linearly distributed in comparison to the static magnetic field distribution of the sagittal plane, Sg. For this reason, the inhomogeneity of the static magnetic field after being subjected to the per-slice static magnetic field shimming in the axial plane is reduced by first-order shimming, in comparison to the inhomogeneity of the static magnetic field after being subjected to the per-slice static magnetic field shimming in the sagittal plane. For example, if the static magnetic field distribution before the per-slice static magnetic field shimming is performed is as shown in FIGS. 3 and 4, the processing circuitry 131 determines the axial direction as a collection direction.

According to the various processes described above, the processing circuitry 131 determines, by the collection direction determination function 1317, a collection direction orthogonal to a series of slices pertaining to the multi-slice imaging, based on the first region and the static magnetic field distributions pertaining to the second region that overlaps at least a part of the first region. A series of slices orthogonal to the collection direction determined by the present step, in other words, a plurality of collection cross sections in which MR signals are collected by the multi-slice imaging which is performed to the third region, is different from the displayed cross section that has been input in step Sa1. For example, if the displayed cross section is the axial plane, the collection cross section is a cross section perpendicular to the oblique direction.

(Image Generation Function)

Figure 5:
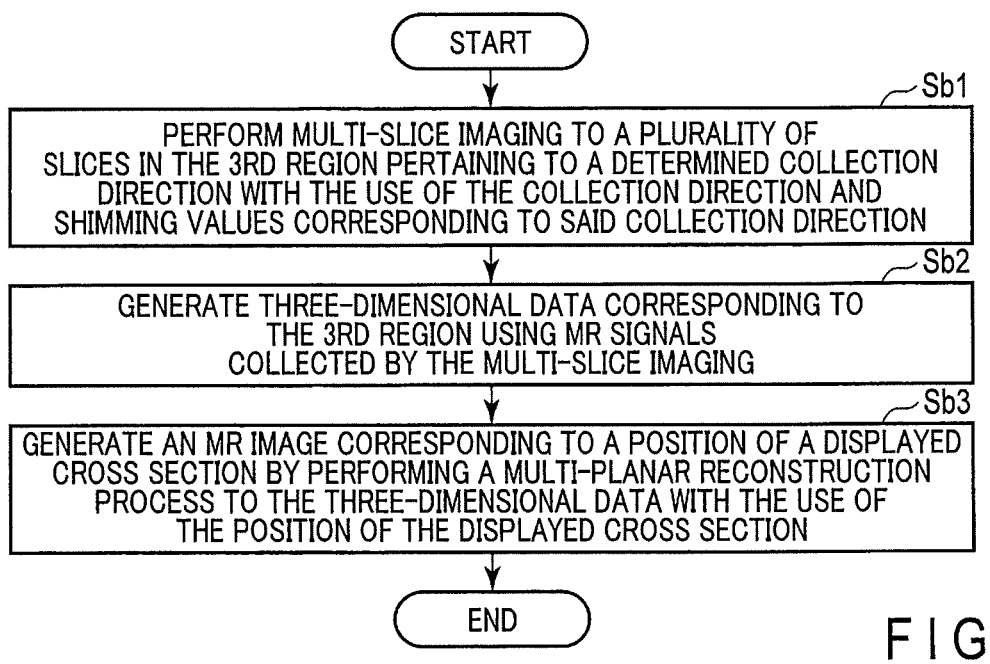
FIG. 5 is a diagram showing an example of the steps of a process relating to generation of a magnetic resonance image corresponding to a displayed cross section by an MPR process performed to generated three-dimensional data.

The operations of the process relating to the three-dimensional generation function 1319 and the image generation function 1313 in the present embodiment will be described with reference to FIG. 5. FIG. 5 is a drawing showing an example of the procedure relating to the process of generating three-dimensional image data (hereinafter, "three-dimensional data") based on MR signals collected by the multi-slice imaging and generating an MR image corresponding to a displayed cross section (hereinafter, "a displayed cross section image generation process") by the MPR process to the three-dimensional data.

(Step Sb1)

The imaging control circuitry 121 performs multi-slice imaging to the third region by using the shimming values corresponding to the determined collection direction and the collection direction. Specifically, the processing circuitry 131 inverts, by the static magnetic field shimming function 1315, a sign of the 0-order shimming value corresponding to the determined collection direction; in other words, it determines, by multiplying a negative sign with the 0-order shimming value, a center frequency (hereinafter "per-slice frequency") of an RF pulse corresponding to each of the slices orthogonal to the collection direction. The processing circuitry 131 outputs the determined per-slice frequency to the imaging control circuitry 121, along with the first-order shimming values per slice in the third region, the collection direction, and the third region. The processing circuitry 131 may determine a frequency shifted by 3.5 ppm from the per-slice frequency, namely a resonance frequency of fat.

The imaging control circuitry 121 performs multi-slice collection to the third region by using the determined frequency per slice, the first-order shimming values per slice, and the collection direction. In this case, the position of the displayed cross section relating to the input in step Sa1 is different from a position of each of the series of slices in the third region relating to the multi-slice imaging. The imaging control circuitry 121 outputs MR signals collected by the multi-slice imaging to the processing circuitry 131.

(Step Sb2)

The processing circuitry 131 generates, by the three-dimensional data generation function 1319, three-dimensional data corresponding to the third region, based on the MR signals collected in the multi-slice imaging. The processing circuitry 131 directs the storage 129 to store the generated three-dimensional data. Specifically, the processing circuity 131 generates a plurality of MR images respectively corresponding to a plurality of slices in the multi-slice imaging, by using the MR signals collected during the multi-slice imaging. The processing circuitry 131 generates the three-dimensional data by interpolating the adjacent MR images by using the plurality of MR images. The three-dimensional data may be called "volume data".

The processing circuitry 131 may generate the three-dimensional data by performing a Fourier transform to MR data arranged in a three-dimensional k-space (hereinafter, "three-dimensional MR data") courtesy of the three-dimensional data generation function 1319. Specifically, the processing circuitry 131 interpolates MR data between two adjacent slices using the MR data in those slices among the slices relating to the multi-slice imaging. Subsequently, the processing circuitry 131 generates three-dimensional MR data using the MR data relating to the slices relating to the multi-slice imaging and the interpolated data. The processing circuitry 131 generates three-dimensional data by performing a Fourier transform to the three-dimensional MR data. The processing circuitry 131 that performs the three-dimensional data generation function 1319 is an example of a means that realizes a three-dimensional data generation unit.

(Step Sb3)

The processing circuitry 131 generates, by the image generation function 1313, an MR image corresponding to the position of the displayed cross section, by performing the MPR process to the three-dimensional data using the position of the displayed cross section. If the three-dimensional data is three-dimensional MR data, the processing circuitry 131 generates MR data corresponding to the position of the displayed cross section (hereinafter "displayed cross section MR data") by the interpolation with the use of the three-dimensional MR data. Subsequently, the processing circuitry 131 generates an MR image corresponding to the position of the displayed cross section by performing a Fourier transform to the displayed cross section MR data. The processing circuitry 131 outputs the generated MR images to the display 127. The display 127 displays the MR image corresponding to the displayed cross section.

According to the above-described configuration, the following advantageous effects can be obtained.

According to the MRI apparatus 100 of the present embodiment, a first region indicating a position of a displayed cross section is input to a locator image, and a collection direction orthogonal to a series of slices relating to the multi-slice imaging is determined based on the first region and a static magnetic field relating to a second region that overlaps at least a part of the first region, and the multi-slice imaging is performed in the collection direction to a plurality of slices in a third region that includes a first region. In other words, according to the present MRI apparatus 100, it is possible to input a position-indicating region indicating a position of a displayed cross section to a locator image, to determine a collection direction relating to multi-slice imaging based on the position-indicating region and a static magnetic field distribution relating to the position-indicating region, and to perform the multi-slice imaging in the collection direction to a plurality of slices in an imaging region that includes at least the position-indicating region.

Further according to the MRI apparatus 100 of the present embodiment, through the performance of the per-slice static magnetic field shimming to each of a plurality of reference regions corresponding to a plurality of reference directions different from a direction orthogonal to a displayed cross section, it is possible to generate a plurality of reference static magnetic field distributions respectively corresponding to the reference regions. This enables calculation, with the use of a static magnetic field distribution corresponding to the first region, of a criterion degree of inhomogeneity indicating inhomogeneity of a static magnetic field in the first region; calculation of, with the use of the reference static magnetic field distributions, a plurality of reference degrees of inhomogeneity that each indicates inhomogeneity of a static magnetic field in each of the references regions and that respectively correspond to the reference directions; and determination of a reference direction that exceeds a criterion degree of inhomogeneity and corresponds to a minimum reference degree of inhomogeneity among the plurality of reference degrees of inhomogeneity.

According to the MRI apparatus 100 in the present embodiment, the displayed cross section is different from any of a plurality of cross sections corresponding to a plurality of slices, and three-dimensional data corresponding to a third region is generated based on MR signals collected in multi-slice imaging, and an MR image corresponding to the displayed cross section is generated by performing cross-section conversion to the three-dimensional data by using the position of the displayed cross section, and the generated MR image is displayed on the display 127. Thus, according to the present MRI apparatus 100, it is possible to generate an MR image corresponding to a position of a displayed cross section, as desired by an operator, through the use of MR data collected in a collection direction that provides good homogeneity of a static magnetic field.

According to the present MRI apparatus 100 according to the present embodiment, among the axial direction, the coronal direction, and the sagittal direction, a direction in which inhomogeneity of a static magnetic field distribution after being subjected to per-slice static magnetic field shimming becomes minimum can be determined as a collection direction. It is thereby possible to shorten a processing time relating to the determination of a collection direction, and to improve throughput of an examination.

As described above, according to the MRI apparatus 100, and the multi-slice imaging method illustrated in FIGS. 2 and 5, it is possible to perform multi-slice imaging in a direction in which homogeneity of static magnetic fields in a series of slices in the third region becomes optimal; in other words, in a collection cross section in which MR signals are collected during the multi-slice imaging and which is different from a displayed cross section where an MR image is displayed, and it is possible to generate a high-quality MR image for any positions of a displayed cross section as desired by an operator.

(Modification)

Figure 6:
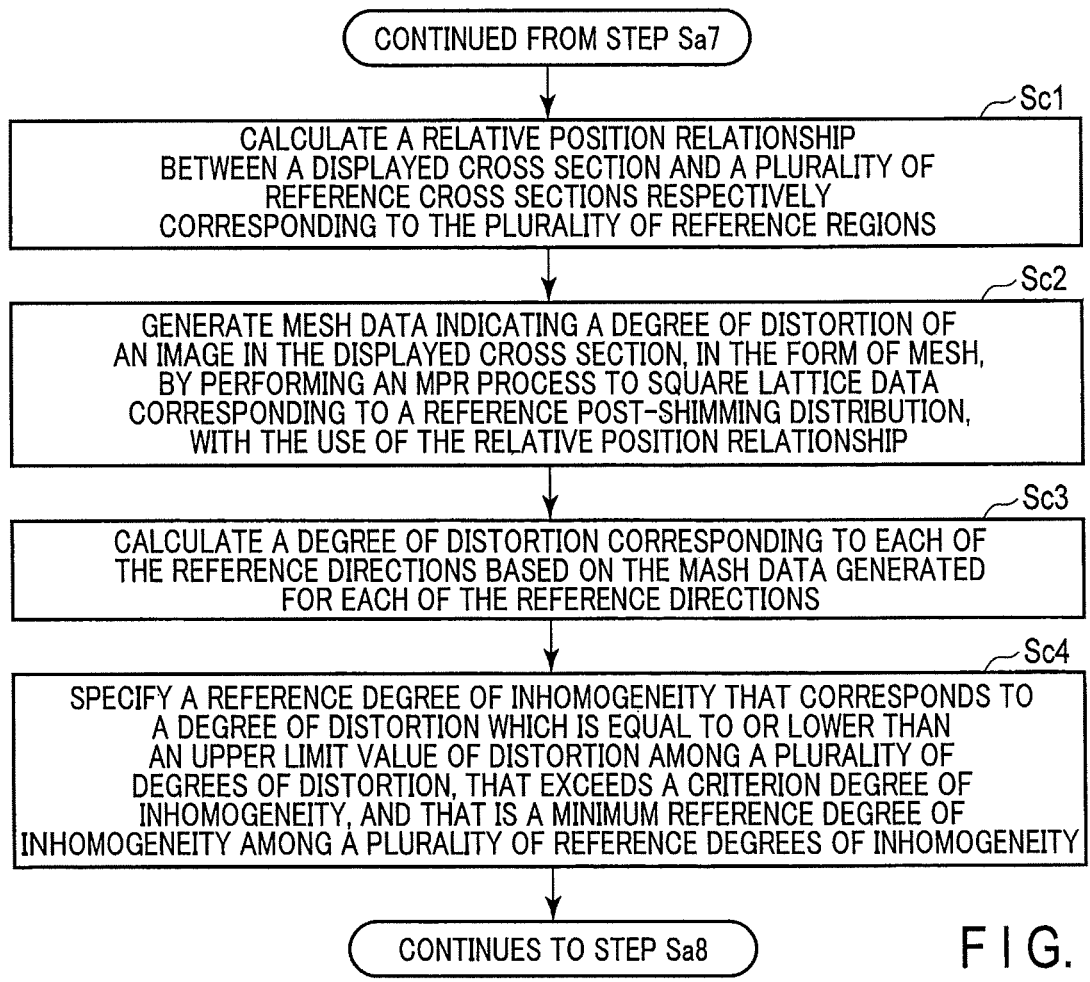
FIG. 6 is a diagram showing an example of the steps of a collection direction determination process in a modification of the embodiment.

A difference between the present modification and the foregoing embodiment lies in that a collection direction is determined in consideration of a degree of distortion, which is caused by the MPR process, of an MR image in a displayed cross section. FIG. 6 is a diagram showing an example of the steps of a process relating to determination of a collection direction in the present modification. The process in step Sc1 through step Sc3 in FIG. 6 is performed, for example, after the process in step Sa6 shown in FIG. 2.

(Collection Direction Determination Process)

(Step Sc1)

The processing circuitry 131 calculates a relative position relationship between a plurality of reference cross sections corresponding to a plurality of reference regions, and a displayed cross section, through the collection direction determination function 1317. The relative position relationship is, for example, a geometrical index such as a distance or an angle, and is calculated for each of the reference directions.

(Step Sc2)

The processing circuitry 131 generates mesh data indicating a degree of distortion of an MR image in a displayed cross section by mesh, through the collection direction determination function 1317. For example, the processing circuitry 131 generates mesh data by performing the MPR process with the application of the relative position relationship to tetragonal lattice data corresponding to the reference post-shimming distribution.

(Step Sc3)

The processing circuitry 131 calculates, through the collection direction determination function 1317, a degree of distortion corresponding to each of the reference directions based on mesh data generated for each of the reference directions. Specifically, the processing circuitry 131 calculates a ratio between lattice intervals in different directions at each of the lattice points in the mesh data. The processing circuitry 131 averages or sums a plurality of ratios corresponding to the lattice points, and calculates a degree of distortion of an MR image of the displayed cross section after the MPR process.

The calculation of a degree of distortion is not limited to the above-described process. For example, the processing circuitry 131 may calculate, through the collection direction determination function 1317, a distortion component of an MR image in the displayed cross section obtained by a calculation of a difference between a two-dimensional tetragonal lattice in the displayed cross section and the mesh data, for example, an amount of distortion corresponding to a warp field (distortion field). At this time, the processing circuitry 131 calculates a degree of distortion using the calculated distortion component.

(Step Sc4)

The processing circuitry 131 specifies, by the collection direction determination function 1317, a reference degree of inhomogeneity that corresponds to a degree of distortion equal to or lower than an upper limit of a degree of distortion (hereinafter, "distortion upper limit value"), exceeds the criterion degree of inhomogeneity, and corresponds to a minimum reference degree of inhomogeneity among the plurality of reference degrees of inhomogeneity. The upper limit of distortion corresponds to a constraint pertaining to spatial resolution of the MR image in the displayed cross section, and is stored in the storage 129 in advance. The processing circuitry 131 performs the process in step Sa1 by using the specified minimum reference degree of inhomogeneity. According to the collection direction determination process in the present modification, a collection direction can be determined in such a manner that a degree of distortion is suppressed to be equal to or lower than the upper limit and the degree of inhomogeneity of a static magnetic field, so as to optimize a conflict (trade-off) between a degree of distortion and a reference degree of inhomogeneity. As an application example of the present modification, the processing circuitry 131 may calculate a reference degree of inhomogeneity and a degree of distortion for every reference direction of the second region, and may determine, as a collection direction, a reference direction that corresponds to a minimum reference degree of inhomogeneity which is equal to or lower than a threshold that ensures homogeneity of a static magnetic field, and that corresponds to a degree of distortion which is equal to or lower than the upper limit of distortion value.

According to the above-described configuration, the following advantageous effects can be obtained.

According to the MRI apparatus 100 in the present application example, it is possible to calculate a plurality of degrees of distortion, each indicating a degree of distortion of an image in a displayed cross section and respectively corresponding to a plurality of reference directions, and to determine, as a collection direction, a reference degree that corresponds to a degree of distortion equal to or lower than the upper limit of a degree of distortion among a plurality of degrees of distortion, exceeds a criterion degree of inhomogeneity, and corresponds to a minimum reference degree of inhomogeneity among a plurality of reference degrees of inhomogeneity.

As described above, according to the present MRI apparatus 100, it is possible to determine a collection direction by further using an upper limit of distortion that is set as a constraint to spatial resolution of an MR image in a displayed cross section, and it is therefore possible to perform multi-slice imaging in a collection direction in which homogeneity of a static magnetic field after being subjected to per-slice static magnetic field shimming becomes optimal, while a quality of the MR image is ensured.

First Application Example

A difference between the present application example and the foregoing embodiment lies in the fact that positions of a series of slices orthogonal to a collection direction determined in step Sa9 in FIG. 2 (hereinafter, "multi-slice positions"), and a first region that is input in step Sa1 in FIG. 2, are superimposed on a locator image, and the superimposed image is displayed on the display 127, thereby making the collection direction adjustable via the interface 125. At this time, the position of the displayed cross section in the first region may also be superimposed on the locator image. The process in the present application example is performed after step Sa9 shown in FIG. 2.

The processing circuitry 131 determines, through the image generation function 1313, the multi-slice positions orthogonal to the determined collection direction in the locator image. The multi-slice positions correspond to a plurality of slice positions in which the multi-slice imaging is performed (in step Sb1). The processing circuitry 131 generates a superimposed image by superimposing the multi-slice positions and the position of the displayed cross section on the locator image.

The display 127 displays the superimposed image and the collection direction before the performance of the multi-slice imaging, which is performed in step Sb1. At this time, a collection direction may be changed by an operator's instruction (hereinafter, "direction change instruction") via the interface 125. The direction-change instruction may be an instruction to adjust the collection direction displayed along with the superimposed image, or an instruction to change the multi-slice positions in the superimposed image. When the collection direction is changed, the processing circuitry 131 updates the superimposed image by the image generation function 1313 by changing the multi-slice positions. The display 127 displays the updated superimposed image. The update of the superimposed image is repeated in accordance with an input of a direction change instruction, until an instruction to determine a collection direction is input through the interface 125. When an instruction to determine a collection direction is input, the processing circuitry 131 recalculates, through the static magnetic field shimming function 1315, a reference shimming value as described in connection with step Sa5, in accordance with the changed collection direction.

Figure 7:
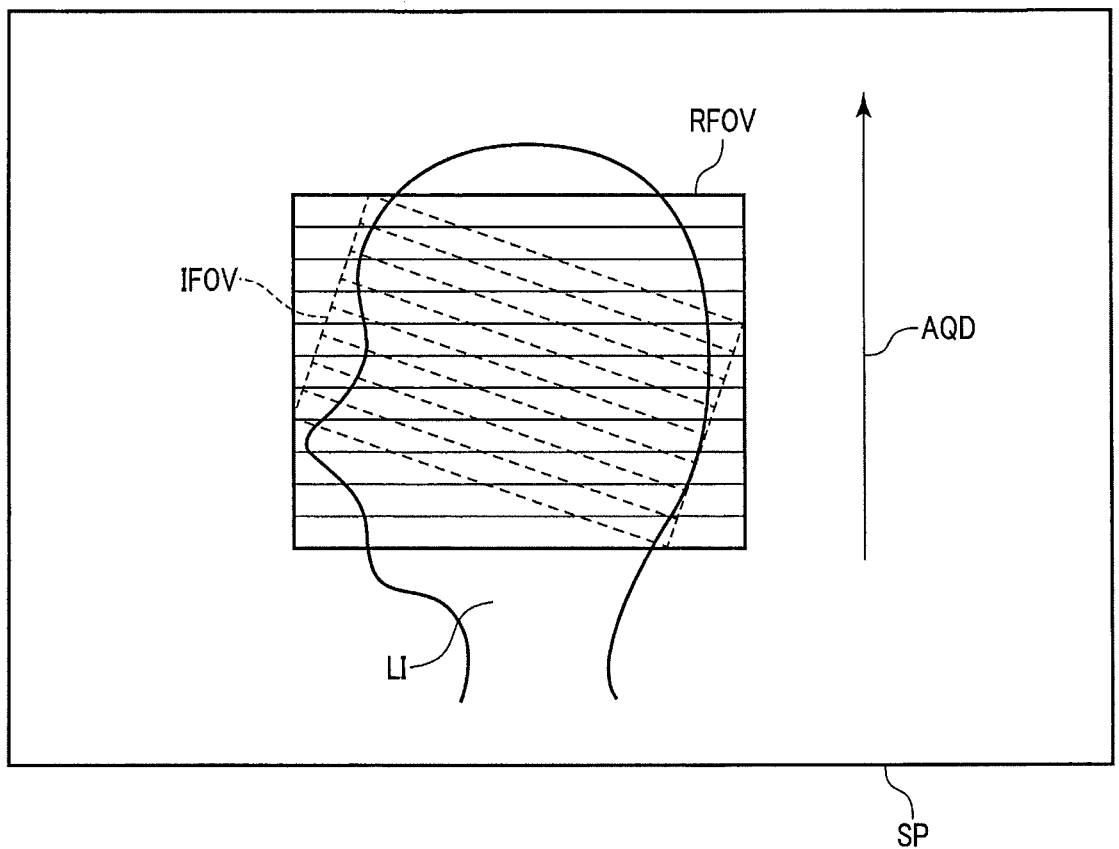
FIG. 7 is a drawing of an example of a superimposed image in a first application example of the embodiment.

FIG. 7 is a drawing of an example of a superimposed image SP in the first application example. The superimposed image SP in FIG. 7 is displayed before the performance of the multi-slice imaging, namely step Sb1, as a scan-plan screen, for example. As shown in FIG. 7, on the locator image L1, the position of the displayed cross section in the first region IFOV, and the multi-slice positions in the third region RFOV are superimposed, along with the collection direction AQD. In accordance with an input of a direction change instruction regarding the collection direction AQD, the multi-slice positions in the third region RFOV are updated and displayed.

According to the above-described configuration, the following advantageous effects can be obtained.

According to the MRI apparatus 100 in the present application example, it is possible to generate a superimposed image by superimposing the positions of a series of slices orthogonal to a determined collection direction and a position of a displayed cross section on a locator image, and to display the generated superimposed image on the display 127. It is thereby possible to display the determined collection direction AQD, the third region RFOV, and the first region IFOV along with the locator image according to the MRI apparatus 100, and for this reason, an operator can adjust the collection direction checking the relative position relationship. As described above, according to the MRI apparatus 100 of the present application example, the operability and throughput regarding the adjustment of a collection direction can be improved.

Second Application Example

Figure 8:
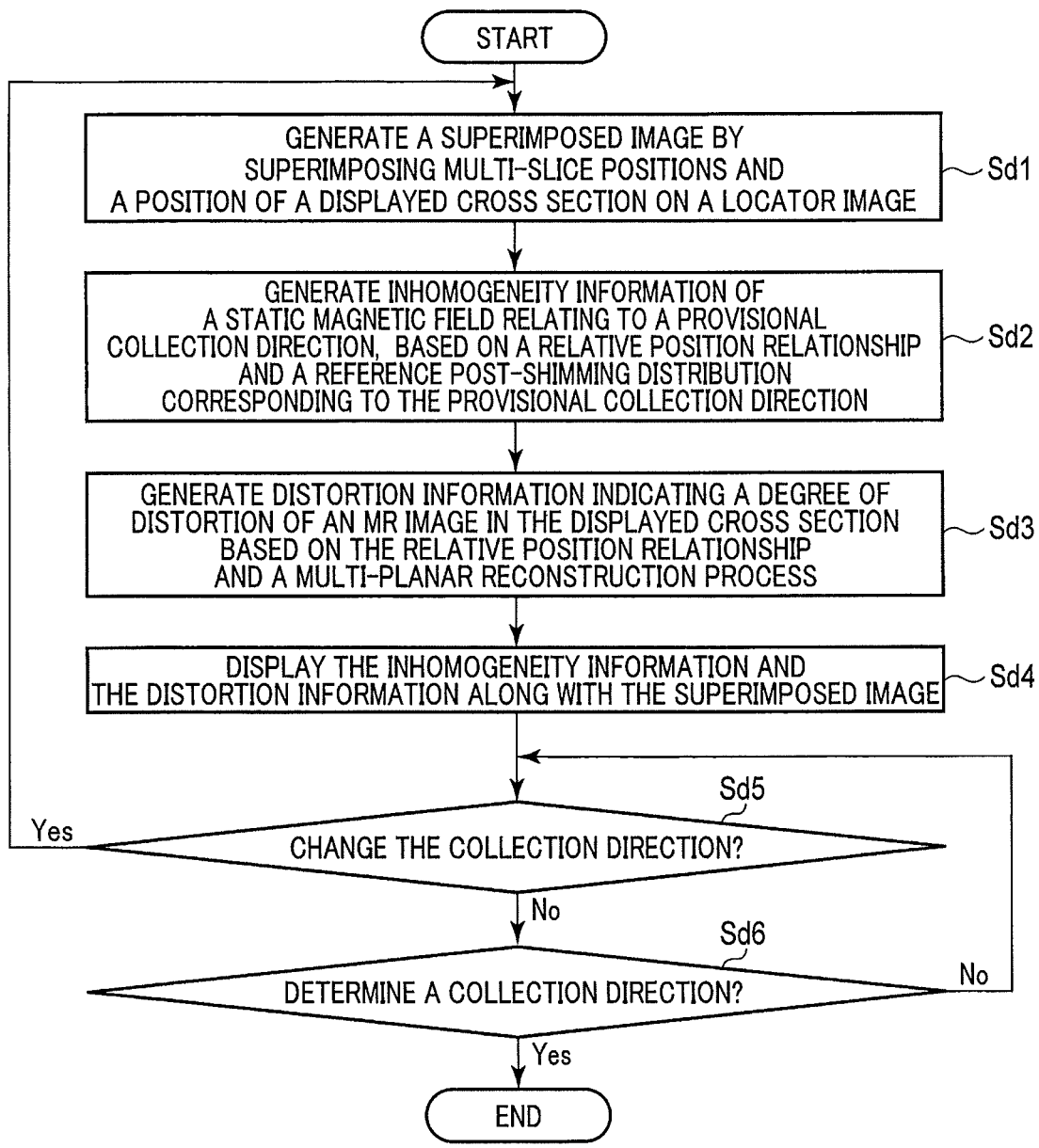
FIG. 8 is a diagram showing an example of the steps of a collection direction determination process in a second application example of the embodiment.

A difference between the present application example and the foregoing embodiment lies in that distortion information, indicating a degree of distortion of an MR image, and inhomogeneity information, indicating a degree of inhomogeneity of a static magnetic field relating to a determined collection direction, are displayed on the display 127, and the collection direction can be adjusted via the interface 125, in addition to the difference between the first application example and the embodiment. FIG. 8 is a diagram showing an example of the steps of the process relating to determination of a collection direction in the present application example. Each of the processes shown in FIG. 8 is performed, for example, after the process in step Sa9 shown in FIG. 2.

(Collection Direction Determination Process)

(Step Sd1)

The processing circuitry 131 generates, by the image generation function 1313, a superimposed image by superimposing a multi-slice position relating to the collection direction determined in step Sa9 in FIG. 2 and a position of the displayed cross section on a locator image. In the present application example, the collection direction determined in step Sa9 is a provisional collection direction. Since the process in this step is similar to the process in the first application example, descriptions are omitted.

(Step Sd2)

The processing circuitry 131 calculates, by the collection direction determination function 1317, a relative position relationship between the multi-slice position relating to the provisional collection direction and the position of the displayed cross section, using the collection direction determined in step Sa9 as the provisional collection direction. The processing circuitry 131 generates inhomogeneity information indicating a degree of inhomogeneity of a static magnetic field relating to the provisional collection direction, based on the calculated relative position relationship and the reference post-shimming distribution corresponding to the provisional collection direction. The inhomogeneity information corresponds to, for example, a static magnetic field distribution after being subjected to the per-slice static magnetic field shimming in the slices in the center portion among the multi-slice positions. The slices relating to the inhomogeneity information are not limited to the slices in the center of the third region, and any slice in the third region can be set. Specifically, the processing circuitry 131 generates the inhomogeneity information by performing the MPR process to the reference post-shimming distribution corresponding to the provisional collection direction, by using the relative position relationship and the slice positions in the center. The inhomogeneity information may be a reference degree of inhomogeneity relating to the provisional collection direction.

(Step Sd3)

The processing circuitry 131 generates, through the collection direction determination function 1317, distortion information indicating a degree of distortion of an MR image in the displayed cross section by the MPR process using the relative position relationship. The distortion information corresponds to, for example, mesh data as described in step Sc2 in the foregoing modification of the embodiment. A warp field may be used as distortion information, instead of mesh data.

(Step Sd4)

Figure 9:
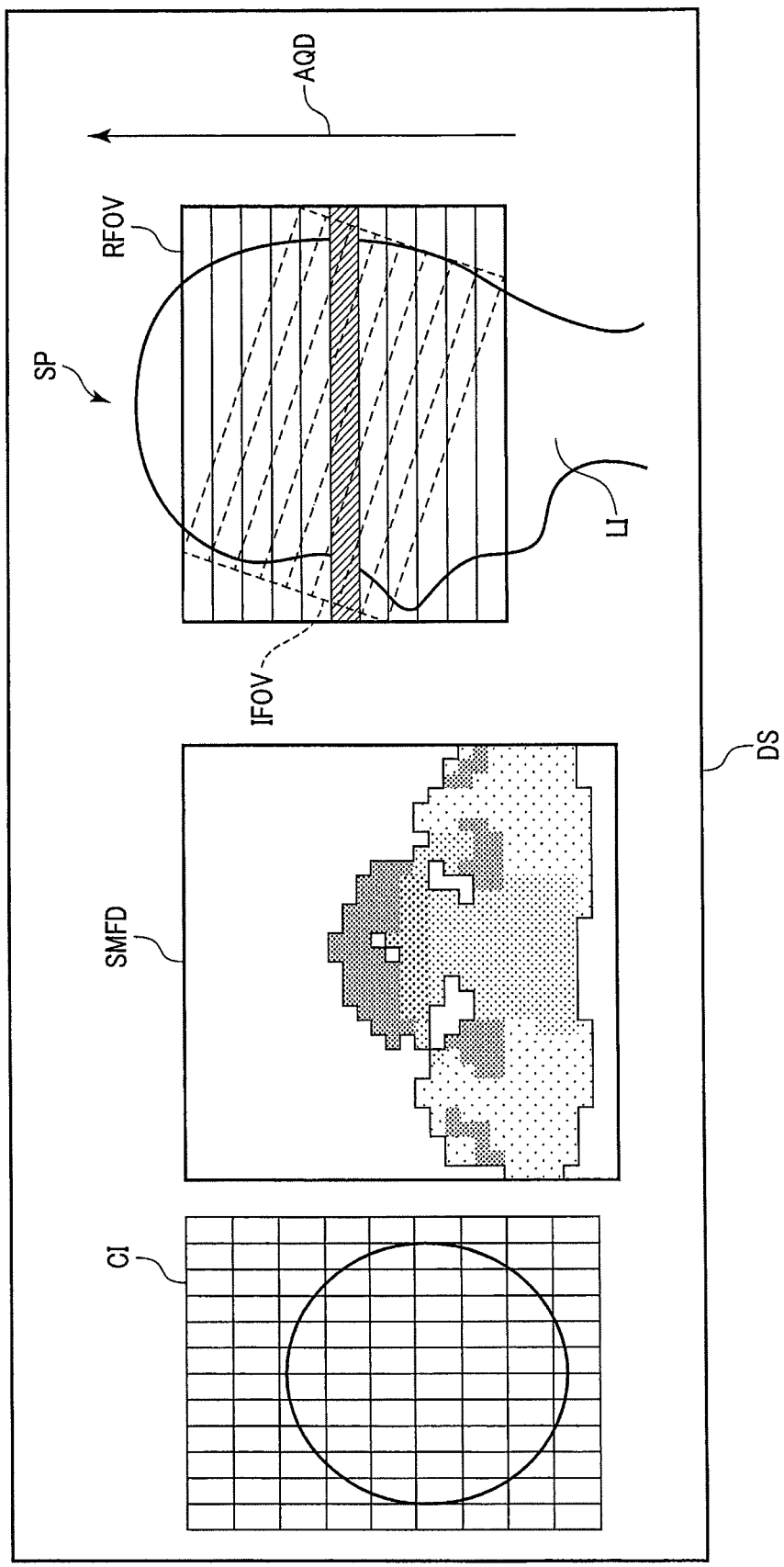
FIG. 9 is a diagram showing an example of each of the following: distortion information, inhomogeneity information, and superimposed image, which are displayed on a display screen of a display, in the second application example of the embodiment.

The display 127 displays the distortion information and the inhomogeneity information along with the superimposed image. For example, the display 127 displays, as the distortion information and the inhomogeneity information, the distortion degree and the degree of inhomogeneity, which are in a trade-off relationship along with the superimposed image. FIG. 9 is a diagram showing an example of each of the following: distortion information CI, inhomogeneity information SMFD, and a superimposed image, which are displayed on a display screen of the display DS of the display 127. The inhomogeneity information SMFD in FIG. 9 is displayed as a color map using the degree of inhomogeneity as color information, for example.

The display screen DS further displays a degree of inhomogeneity and a standard deviation, etc. as inhomogeneity information. The shaded portion in the superimposed image SP is a slice corresponding to the inhomogeneity information SMFD. The inhomogeneity information SMFD may show a two-dimensional static magnetic field distribution after being subjected to the per-slice static magnetic field shimming in the center of the first region IFOV. The inhomogeneity information SMFD may be superimposed on the distortion information CI as a static magnetic field distribution which is indicated in the form of a color map.

(Step Sd5)

The direction change instruction regarding the collection direction AQD is input by an operator through the interface 125 (Yes in step Sd5), the process from step Sd1 through step Sd4 is repeated using the changed collection direction. In other words, the processing circuitry 131 changes, through the collection direction determination function 1317, the collection direction in accordance with the operator's instruction input into the superimposed image SP. Subsequently, the processing circuitry 131 updates, by the image generation function 1313, the superimposed image in accordance with a relative position relationship regarding the changed collection direction, as described above in connection with step Sd1.

In addition, the processing circuitry 131 updates the distortion information and the inhomogeneity information in accordance with the relative position relationship regarding the changed collection direction, in line with the foregoing description of step Sd2 and step Sd3. The display 127 displays the updated distortion information and inhomogeneity information along with the updated superimposed image, as described in connection with step Sd4. If the collection direction AQD is unchanged, the process proceeds to step Sd6.

(Step Sd6)

If an instruction to determine a collection direction is not input via the interface 125 (No in step Sd6), the process returns to step Sd5. If an instruction to determine a collection direction is input via the interface 125 (Yes in step Sd6), the process in step Sb1 shown in FIG. 5 is performed.

According to the above-described configuration, the following advantageous effects can be obtained.

According to the MRI apparatus 100 in the present application example, it is possible to generate distortion information, indicating a degree of distortion of an MR image, in a displayed cross section by the multi-planar reconstruction process using a relative position relationship between a position of the displayed cross section and positions of a series of slices orthogonal to a collection direction; to generate inhomogeneity information, indicating a degree of inhomogeneity of a static magnetic field relating to a collection direction, based on the relative position relationship and a static magnetic field after being subjected to the per-slice static magnetic field shimming in the collection direction; and to display the distortion information and the inhomogeneity information on the display 127 along with a superimposed image. In other words, according to the present MRI apparatus 100, the degree of distortion and the degree of inhomogeneity, which are in a trade-off relationship, can be displayed as distortion information and inhomogeneity information, along with a superimposed image.

According to the present MRI apparatus 100, it is possible to change a collection direction in accordance with an operator's instruction that is input to the superimposed image, to update the distortion information and the inhomogeneity information in accordance with a relative position relationship corresponding to the changed collection direction; to update the superimposed image in accordance with the relative position relationship corresponding to the changed collection direction; and to display the updated distortion information and the updated inhomogeneity information on the display 127 along with the updated superimposed image.

As described above, according to the MRI apparatus 100, the distortion information, the inhomogeneity information, and the superimposed image can be updated in accordance with a change of collection direction and displayed; accordingly, an operator can adjust the collection direction while looking at the relative position relationship, distortion information, and the inhomogeneity information. Furthermore, the operability and throughput regarding the adjustment of a collection direction can be improved.

As a modification of the foregoing embodiment and application examples, if the technical idea of the present MRI apparatus 100 is realized by cloud computing or the like, a server on the Internet may have the storage 129 and the processing circuitry 131 shown in the schematic diagram of FIG. 1. At this time, the image generation function 1313, the static magnetic field shimming function 1315, the collection direction determination function 1317, and the three-dimensional data generation function 1319 etc. are realized by installing a program (a medical processing program) that executes these functions onto the processing apparatus 131 of a server and expanding these functions in a memory.

The transmitter in the present specification may be a structure that realizes its function by a hardware or a combination of hardware and software, in addition to a case where the function is realized by the transmission circuitry 113 described in the embodiment. The receiver in the present specification may be a structure that realizes its function by a hardware or a combination of hardware and software, in addition to a case where the function is realized by the reception circuitry 119 described in the embodiment. The imaging controller in the present specification may be a structure that realizes its function by a hardware or a combination of hardware and software, in addition to a case where the function is realized by the imaging control circuitry 121 described in the embodiment. The processor in the present specification may be a structure that realizes its function by a hardware or a combination of hardware and software, in addition to a case where the function is realized by the processing circuitry 131 described in the embodiment.

According to at least one of the above-described embodiments, a collection direction in the multi-slice imaging can be determined, while a quality of an MR image is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
an interface that inputs, to a locator image, a position-indicating region indicating a position of a displayed cross section;
processing circuitry that determines a collection direction relating to multi-slice imaging, based on a static magnetic field distribution relating to the position-indicating region and said position-indicating region; and
imaging control circuitry that performs the multi-slice imaging in the collection direction to a plurality of slices in an imaging region which includes at least the position-indicating region.

2. The magnetic resonance imaging apparatus according to claim 1, wherein
the displayed cross section is different from a plurality of cross sections corresponding to the slices.

3. The magnetic resonance imaging apparatus according to claim 2,
the processing circuitry
generates three-dimensional data corresponding to the imaging region based on a magnetic resonance signal collected by the multi-slice imaging, and
generates a magnetic resonance image corresponding to the displayed cross section by performance of a multi-planar reconstruction process section conversion to the three-dimensional data with a use of a position of the displayed cross section, and
further comprises a display for displaying the magnetic resonance image.

4. The magnetic resonance imaging apparatus according to claim 3, wherein
the processing circuitry generates a superimposed image by superimposing the positions of the slices orthogonal to the collection direction and the position of the displayed cross section on the locator image, and
the display displays the superimposed image.

5. The magnetic resonance imaging apparatus according to claim 1, wherein
the processing circuitry
generates a plurality of reference static magnetic field distributions respectively corresponding to a plurality of reference regions by performing per-slice static magnetic field shimming to each of the reference regions respectively corresponding to a plurality of reference directions which are different from a direction orthogonal to the displayed cross section,
calculates a criterion degree of inhomogeneity, indicating inhomogeneity of a static magnetic field in the position-indicating region, by a use of the static magnetic field distribution corresponding to the position-indicating region,
calculates a plurality of reference degrees of inhomogeneity respectively indicating inhomogeneity of a static magnetic field in each of the reference regions and respectively corresponding to the plurality of reference directions, with a use of the reference static magnetic field distribution, and
determines, as the collection direction, the reference direction that exceeds the criterion degree of inhomogeneity and corresponds to a minimum reference degree of inhomogeneity among the plurality of reference degrees of inhomogeneity.

6. The magnetic resonance imaging apparatus according to claim 5,
the processing circuitry
calculates a plurality of degrees of distortion indicating a degree of distortion of an image in the displayed cross section and respectively corresponding to the reference directions, based on a relative position relationship between positions of a plurality of slices orthogonal to the reference directions and a position of the displayed cross section, and
determines, as the collection direction, the reference direction that corresponds to a degree of distortion equal to or lower than an upper limit value of the degree of distortion among the plurality of degrees of distortion, that exceeds the criterion degree of inhomogeneity, and that corresponds to a minimum reference degree of inhomogeneity among the plurality of reference degrees of inhomogeneity.

7. The magnetic resonance imaging apparatus according to claim 4,
the processing circuitry
generates distortion information, indicating a degree of distortion of the magnetic resonance image, by a multi-planar reconstruction process using a relative position relationship between the position of the displayed cross section and the positions of the slices,
generates inhomogeneity information, indicating a degree of inhomogeneity of a static magnetic field of the imaging region relating to the collection direction, based on the relative position relationship and the static magnetic field distribution, and
the display displays the distortion information and the inhomogeneity information along with the superimposed image.

8. The magnetic resonance imaging apparatus according to claim 7,
the processing circuitry
changes the collection direction in accordance with an operator's instruction input to the superimposed image,
updates the distortion information and the inhomogeneity information in accordance with the relative position relationship corresponding to the changed collection direction,
updates the superimposed image in accordance with the relative position relationship corresponding to the changed collection direction, and
the display displays the updated distortion information and the updated inhomogeneity information along with the updated superimposed image.

9. The magnetic resonance imaging apparatus according to claim 1, wherein
the processing circuitry determines, among an axial direction, a coronal direction, and a sagittal direction, a direction in which a degree of inhomogeneity of the static magnetic field distribution becomes minimum as the collection direction.

10. A multi-slice imaging method comprising:
inputting, to a locator image, a position-indicating region indicating a position of a displayed cross section;
determining a collection direction relating to multi-slice imaging based on a static magnetic field distribution relating to the position-indicating region and said position-indicating region; and performing the multi-slice imaging in the collection direction to a plurality of slices in an imaging region which includes at least the position-indicating region.

* * * * *